United States Patent [19]
Rush

[11] Patent Number: 5,742,181
[45] Date of Patent: Apr. 21, 1998

[54] FPGA WITH HIERARCHICAL INTERCONNECT STRUCTURE AND HYPERLINKS

[75] Inventor: Kenneth Rush, Colorado Springs, Colo.

[73] Assignee: Hewlett-Packard Co., Palo Alto, Calif.

[21] Appl. No.: 657,990

[22] Filed: Jun. 4, 1996

[51] Int. Cl.$^6$ .................... H03K 19/177; H03K 19/173
[52] U.S. Cl. .................................. 326/41; 326/38
[58] Field of Search ........................ 326/38, 39, 41

[56] References Cited

U.S. PATENT DOCUMENTS

| | | | |
|---|---|---|---|
| 4,038,564 | 7/1977 | Hakata | 307/205 |
| 4,620,188 | 10/1986 | Sengchanh | 340/825.87 |
| 4,642,487 | 2/1987 | Carter . | |
| 4,727,268 | 2/1988 | Hori . | |
| 5,031,139 | 7/1991 | Sinclair | 364/900 |
| 5,191,242 | 3/1993 | Agrawal et al. . | |
| 5,317,698 | 5/1994 | Chan | 395/325 |
| 5,359,242 | 10/1994 | Veenstra . | |
| 5,359,536 | 10/1994 | Agrawal et al. | 364/489 |
| 5,376,844 | 12/1994 | Pedersen et al. | 326/41 |
| 5,384,499 | 1/1995 | Pedersen et al. | 326/39 |
| 5,414,638 | 5/1995 | Verhayen et al. | 364/489 |
| 5,455,525 | 10/1995 | Ho et al. | 326/41 |
| 5,457,409 | 10/1995 | Agrawal et al. | 326/39 |
| 5,457,410 | 10/1995 | Ting | 326/41 |
| 5,528,176 | 6/1996 | Kean | 326/41 |
| 5,552,722 | 9/1996 | Kean | 326/41 |
| 5,594,363 | 1/1997 | Freeman et al. | 326/41 |
| 5,631,578 | 5/1997 | Clintion et al. | 326/41 |

FOREIGN PATENT DOCUMENTS

PCT/US94/
03620  10/1994  WIPO .

OTHER PUBLICATIONS

"Self–Timed Simultaneous Bidirectional Signalling for IC Systems", G.Y. Yacoub and W.H. Ku, IEEE (1992).

"A 900 Mb/s Bidirectional Signaling Scheme", Randy Mooney, Charles Dike, and Shekhar Borkar, IEEE (1995).

"FPGA 1994 2nd International ACM/ Sigda Workshop of Field–Programmable Gate Arrays", Russell Tessier, Jonathan Babb, Matthew Dahl, Silvina Hanono, and Anant Agarwal, Feb. 13–15, 1994.

"IEEE Workshop on FPGAs for Custom Computing Machines", Jonathan Babb, Russell Tassier, and Anant Agarwal, Apr. 5–7, 1993.

*Primary Examiner*—Edward P. Westin
*Assistant Examiner*—Richard Roseen

[57] ABSTRACT

A programmable logic device including a plurality of programmable atomic logic elements (PALEs) where each PALE has a plurality of data inputs and generates a data output signal. The PALEs are logically arranged as a plurality of hierarchically coupled partitions. Each partition is defined by a unique set of the next lower hierarchy partitions and an interconnect bus that extends only to the unique set of the next lower partitions that are within that partition. The lowest level of hierarchy is one of the plurality of PALEs. A plurality of hyperlinks provided within each PALE programmably couples the PALE data output signal to each of the interconnect busses in each of the higher levels of hierarchy that include the PALE. Preferably, the PALE also includes a tunnel connection for coupling the PALE data output signal to adjacent neighbor PALEs without using the interconnect bus of any of the partitions.

18 Claims, 6 Drawing Sheets

FPGA WITH HIERARCHICAL INTERCONNECT STRUCTURE AND HYPERLINKS

BACKGROUND OF THE INVENTION

1. Field of the Invention.

The present invention relates, in general, to, programmable logic devices and, more particularly, to a field programmable gate array having a hierarchical architecture and hyperlinks for creating programmable interconnects.

2. Statement of the Problem.

Field-programmable gate arrays (FPGAs) have been used for several years to quickly implement customer designed logic circuits. However, the logic density and performance of FPGAs is an order of magnitude lower than circuits implemented using application specific integrated circuit (ASIC) technology due to the overhead created by the additional circuitry necessary to make the FPGA user programmable. Hence, FPGAs are primarily used to implement relatively simple logic circuits. However, there is a growing need for FPGAs that are capable of implementing very large circuits in order to verify and optimize circuit designs. Such verification can greatly decrease the amount of time that is required to design an ASIC so long as the FPGA can be quickly configured to functionally emulate the ASIC design.

The architecture of a typical FPGA comprises an array of fundamental logic elements that can be programmably interconnected to realize different circuit designs. The fundamental logic elements can be programmable to generate one or more data output signals that are selected combinatorial or sequential logical functions of one or more data input signals. Alternatively, the fundamental logic blocks can be a fixed combination of AND and OR gates that generate the desired combinatorial or sequential output by selecting the data inputs to each logic element. The logic blocks can be as simple as a transistor or as complex as a microprocessor.

An FPGA is programmed using electrically programmable switches in a similar manner to traditionally programmable logic devices (PLD's). Traditionally PLDs use a simple but inefficient crossbar-like interconnect architecture in which every logic element output is directly connectable to every logic block input through one switch. Modern FPGA's use a more efficient interconnect architecture where each connection typically passes through several switches.

The overall goals of FPGA interconnect architecture is to (1) provide rich programmable interconnection between the fundamental logic elements; (2) allow the chip to implement a large variety of designs; (3) provide a high data bandwidth for fast operation; and (4) to transfer a large amount of data between integrated circuit chips in a multi-chip-module design. Preferably the interconnect architecture is designed and fabricated with step-and-repeat processes;

FPGA's are implemented in large scale integrated circuit technology. Typically, an FPGA interconnect architecture uses wire segments of varying lengths that can be interconnected via electrically programmable switches. The choice of the number of wire segments incorporated effects the density achieved by an FPGA. An inadequate number of segments results in underutilization of the logic elements. Excess wire segments waste space without improving interconnect performance- The distribution and density of the lengths of wire also affects performance of an FPGA. If all segments are long, implementing local interconnections becomes too costly in area and increases propagation delay. On the other hand, if all segments are too short, long interconnections require multiple switches connected in series resulting in large propagation delays. A need exists for an FPGA interconnect architecture that efficiently allocates long and short wires so as to implement a large variety of designs without sacrificing too much chip area to the interconnect structure.

Large integrated circuits are most efficiently designed by "step and repeat" processes. In step and repeat designs a small block of circuitry is designed and large areas of the circuit are filled by creating an array of the small blocks. In this manner, design effort can be focused on the small block or "tile" and the chip area populated with exact replicas of the small block. Step and repeat designs are used widely in circuitry such as memory and "flat" FPGA architectures where all fundamental logic blocks are essentially identical. Unfortunately, step and repeat designs impose limitations on FPGA chip designs that have prevented implementation of more sophisticated and efficient interconnect architectures. A need exists for an FPGA architecture that allows sophisticated and complex interconnection while being amenable to step and repeat processing of tiles across large portions of the chip area.

Conventional FPGA's use "channel routing" structures in which programmable elements are arranged so as to leave spaces or channels between groups of programmable elements. These channels are used to provide interconnect wiring. Channel routing interconnect structure is easy to implement with step and repeat processes but results in poor chip area efficiency and slow compiler software. Because channel routing does not impose an order (which is desirable from a step and repeat IC layout standpoint) the compilation (i.e., placement, routing of the design into the FPGA) is very difficult. When large integrated circuit chips are involved, the design space (i.e., the memory space required in a computer used to perform the compilation) rapidly increases to unmanageable proportions.

There is growing interest in using FPGA technology in the application specific integrated circuit (ASIC) design process. In the past, ASICs were designed then simulated on a computer using software models of the various components. The simulation serves to evaluate ASIC functionality before the expensive process of generating masks and silicon. However, it requires many man-hours of effort to develop a simulation program for complex ASIC devices. Moreover, the simulation program may itself take many weeks to run on a computer. Hence, there is growing interest in using FPGA technology to emulate rather than simulate an ASIC design. However, prior FPGA architectures, when scaled to size sufficient to support ASIC emulation, could not be compiled on commonly available computers or workstations and FPGA programming was slow.

The FPGA physical and logical architecture interacts with the compilation software used to implement circuit designs in the FPGA. The compilation software, or compiler, takes gate-level (i.e., structural) netlists as input and outputs a binary image with embedded commands that can be used to efficiently program the FPGA. Two major operations performed by the compilation software are "placement" and "routing". Placement involves partitioning a circuit design by repeatedly dividing it into networks that are small enough to be implemented by a single programmable element in the FPGA. Placement is subject to the constraints of pin placement, logic analysis specification, and customer specified constraints. Symmetrical partitioning such as mincut bipartition methods are commonly used but do not offer the most efficient use of silicon area when high level interconnect and routing are considered. The routing process then routes the required logic subject to the placement constraints, fault mapping, fanout limitations, and other routing limitations specified for a particular circuit design.

Prior symmetrical FPGA architectures confound the problems of placement and routing because as each net is placed it commits certain interconnect resources that are shared with the remaining, unplaced portions of the logic design. As the circuit design is placed, the routing resources become overcommited and the circuit must be "ripped up". The place, route, and rip-up processes are repeated iteratively to create the final compilation. Compilation software combats this problem by giving priority to either placement or routing depending on the FPGA architecture. In order to avoid the inefficiencies of repeated placement and routing, an FPGA architecture is needed that substantially isolates the placement and routing problems.

As an alternative to the commercially available "flat" or "symmetrical" FPGA architectures, researchers have studied hierarchical architectures for several years. The paper titled "Routing Architectures for Hierarchical Field Programmable Gate Arrays" by Aditya A. Agarwal and David M. Lewis in FPGA '94 (proceedings of the 2nd International ACM/SIGDA Workshop on Field-Programmable Gate Arrays) (Feb. 13, 1994) describes hierarchical interconnect architecture. Hierarchical interconnect architectures take advantage of the hierarchy that exists in most digital circuit designs. Systems designed hierarchically tend to have locality in wiring (i.e., the number of short interconnects between physically close elements is greater than the number of long wires between physically distant elements). In a hierarchical architecture, the logic elements are organized in groups, or hierarchy levels, such that each group contains interconnect wires that support communication only within that group. Separate wires are provided to enable communication between the groups. A hierarchical interconnect architecture allows user circuit designs to be implemented using a mix of short and long wiring resources more closely matching a mix that would result if the circuit were implemented in an ASIC or dedicated IC design.

The routing architecture evaluated by Agarwal et al. did provide improved local interconnection. Also, the Agarwal structure demonstrated that the maximum number of switches in any path of an n-level hierarchy was 2×n which was better than a competing symmetrical or flat architectures. However, this worst case becomes increasingly unacceptable for designs with more levels of hierarchy. A fundamental difficulty is that in prior hierarchical structures a connection has to be made from the lowest level of hierarchy upward through each higher level to the very highest level, then downward through each level to the destination logic element. At each transition from one level to the next the connection must add a series switch and must consume a length of wire. Propagation delays are large and interconnect resources are quickly exhausted. What is needed is a hierarchical interconnect structure that provides improved local interconnectivity at the same time as long interconnections using fewer switches and shorter wiring lengths.

U.S. Pat. No. 5,455,525 issued to Ho et al. on Oct. 3, 1995 describes a hierarchical FPGA architecture similar to that described by Agarwal et al. The Ho architecture interconnected each level of hierarchy by a row and column bus such that intra-level connections would require at most one switch. The Ho et al. structure distributed signals between logical groupings on a given level by connecting upward through the levels of hierarchy one at a time. Alternatively, Ho et al. created interconnections from one hierarchy group to a physically adjacent peer to enable connections without using resources of the hierarchical interconnect structure. However, the Ho et al. structure does not reduce the number of switches required to make connections between logic elements in nonadjacent hierarchy groupings (i.e., peers). Further, the Ho et al. structure is difficult to implement in a tileable structure because the interconnect structure is formed along the periphery of each hierarchy grouping.

SUMMARY OF THE INVENTION

Briefly stated, the present invention involves a programmable logic device including a plurality of programmable atomic logic elements (PALEs) where each PALE has a plurality of data inputs and generates a data output signal. The PALEs are logically arranged as a plurality of hierarchically coupled partitions. Each partition is defined by a unique set of the next lower hierarchy partitions and an interconnect bus that extends only to the unique set of the next lower partitions that are within that partition. The lowest level of hierarchy is one of the plurality of PALEs. A plurality of hyperlinks provided within each PALE programmably couples the PALE data output signal to each of the interconnect busses in each of the higher levels of hierarchy that include the PALE. Preferably, the PALE also includes a tunnel connection for coupling the PALE data output signal to adjacent neighbor PALEs without using the interconnect bus of any of the partitions.

DETAILED DESCRIPTION OF THE DRAWING

1. Overview.

An efficient large area integrated circuit requires that the design take advantage of step and repeat processes as much as possible. This is called a "tile" architecture wherein a single complex tile is designed and then repeated in a regular array about the body of the integrated circuit. For basic element or "tile" to be tileable it must carry the full hierarchy bus structure as atomic pieces and parts that, when connected together form long and short busses in the vertical and horizontal directions.

In the preferred implementation of the present invention described herein, each tile comprises a fundamental programmable element called a programmable atomic logic element (PALE). Each PALE is surrounded by atomic pieces of the hierarchical interconnect network as well as a number of programmable switches to form the tile. When tiles are placed side by side, six levels of interconnect bus hierarchy are formed as well as local and special purpose interconnections.

In general, each hierarchical level in the interconnect network supports electrical communication within subsections of an emulation system. These subsections are referred to as "leaves", "blocks", "sectors", "chips" and a "system". For ease of understanding, these elements (described in greater detail below) are related to each other as set out in Table 1.

TABLE 1

| Subsection name | Description | Interconnect Level |
| --- | --- | --- |
| NEIGHBORHOOD | All PALES immediately adjacent to a given PALE | Level 0 |
| LEAF | Four PALEs | Level 1 |
| BLOCK | Sixteen LEAVEs | Level 2 |
| SECTOR | Fifteen BLOCKs | Level 3 |
| CHIP | Three SECTORs | Level 4 |
| SYSTEM | Six CHIPs | Levels 5 and 6 |

The interconnect level listed in Table 1 for each subsection represents the interconnect level that supports communication between elements within that subsection. When communication is required outside of a particular subsection, an interconnection must be made using a higher level of the hierarchy.

Figure 1:
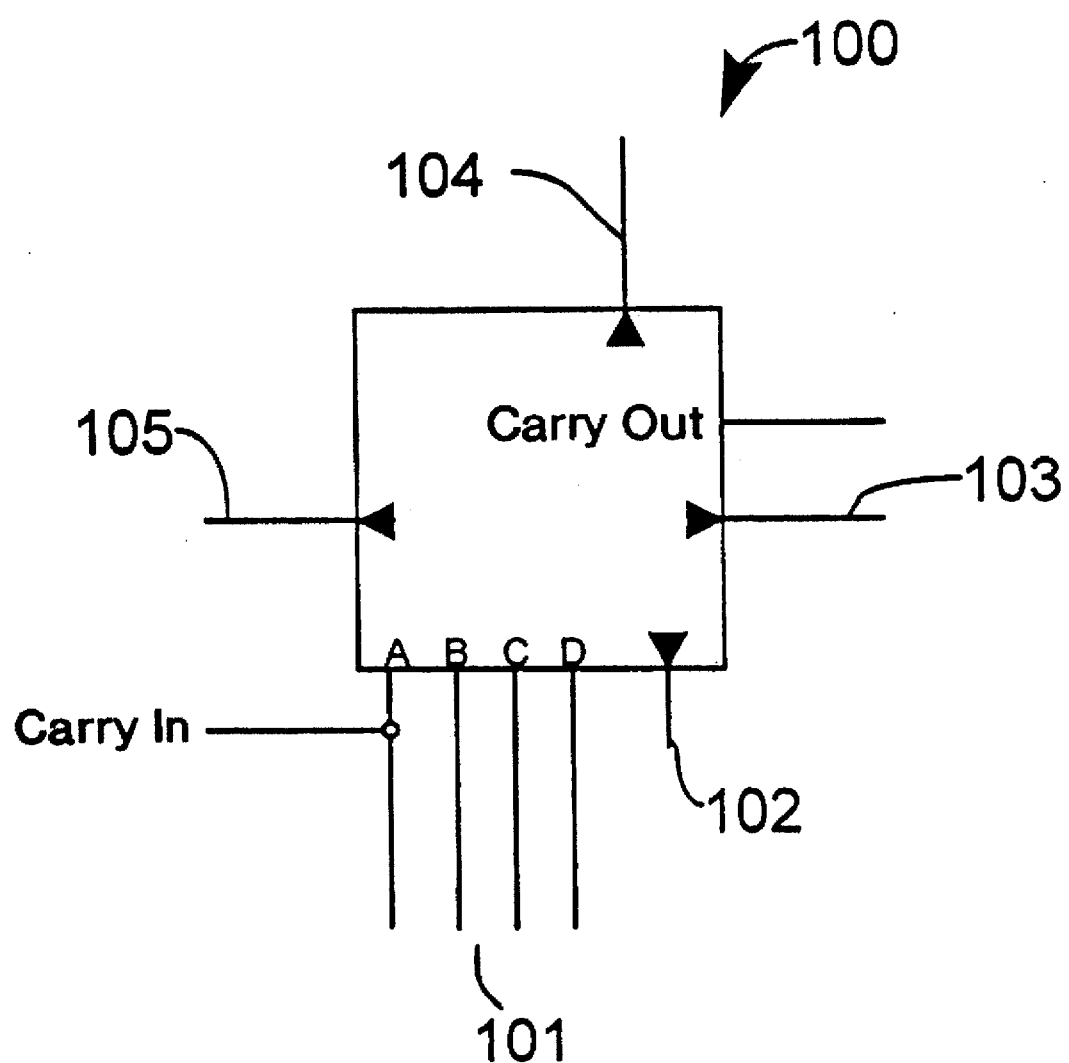
FIG. 1 shows in block diagram form an example fundamental programmable element used in the FPGA architecture in accordance with the present invention.

FIG. 1 shows a PALE 100 in block diagram form that accepts four data input signals A, B, C, D, and a carry input signal. A number of tunnel input signals (shown in FIG. 2) couple to the A, B, C, and D input signals. PALE 100 generates a single data output signal that is available on four outputs including tunnel output 102, level one/two output 103, level three output 104, and level four output 105 as well as a carry output signal. PALE 100 is designed to support five or more levels of interconnect hierarchy on a single chip. The specific design shown in FIG. 1 is merely an example, and any number of data input and data outputs can be used. The carry input and carry output are optional. Inputs required to program PALE 100 are not shown and control inputs such as clock signals, enable signals, and set/reset signals are not shown for ease of description.

While the preferred implementation is described in terms of a specific PALE and tile design arranged in a orthogonal array, it should be understood that a variety of PALE and tile designs are possible and alternative arrays can be used. The present invention is illustrated and described in terms of its logical structure. In practice the physical structure implemented on a semiconductor integrated circuit may resemble the logical structures illustrated herein, however, the physical implementation may vary substantially from the logical structure without departing from the teachings of the present invention. The particular nomenclature, size, and scale limitations specified in the preferred implementation are provided as example only and should not be interpreted as limitations on the teachings of the present invention.

2. Programmable Atomic Logic Element

The fundamental logic block used in the specific example illustrated and described herein is referred to as a programmable atomic logic element (PALE). A detailed understanding of the internal construction and operation of the PALE is not necessary to understand the principles of the present invention. It is sufficient to implement the PALE using any of a number of known programmable building blocks that can generate an output that is a programmable logic function of a number of inputs. Also, many of the advantages of the present invention can be achieved even if the fundamental logic elements are not programmable. The details and specifications as to the PALE design of the preferred implementation are provided herein for the purpose of completeness.

PALE 100, illustrated in block diagram form in FIG. 1, is configurable to implement any four-input, one-output logic function or any two three-input, one-output functions in the specific example. PALE 100 has four data inputs (labeled A–D). Various clock and control inputs necessary for a practical structure are not shown so as to emphasize the logical architecture of the present invention. Such clock and control structures can be implemented using known technology or, for example, by a control structure as described in U.S. patent application Ser. No. 08/657,582 owned by the assignee of the present invention.

The four data inputs A–D terminate within tile 200 (shown in FIG. 2) and are not used directly to couple signals between tiles. A Carry-In line is programmably coupled into the A data input line in the specific example shown in FIG. 1, although it could be omitted or coupled directly as a separate input into PALE 100.

PALE 100 produces one data output signal that is distributed to multiple data output drivers indicated by dark triangles 102, 103, 104, and 105 shown in FIG. 1. Each output driver 102–105 is programmably coupled to selected levels of the hierarchical interconnect structure as described in greater detail hereinafter. Multiple output drivers are used in order to increase the number of hierarchical levels that are directly accessible to the output of any given PALE, thus easing the interconnect problems.

3. Tile Architecture.

Figure 2:
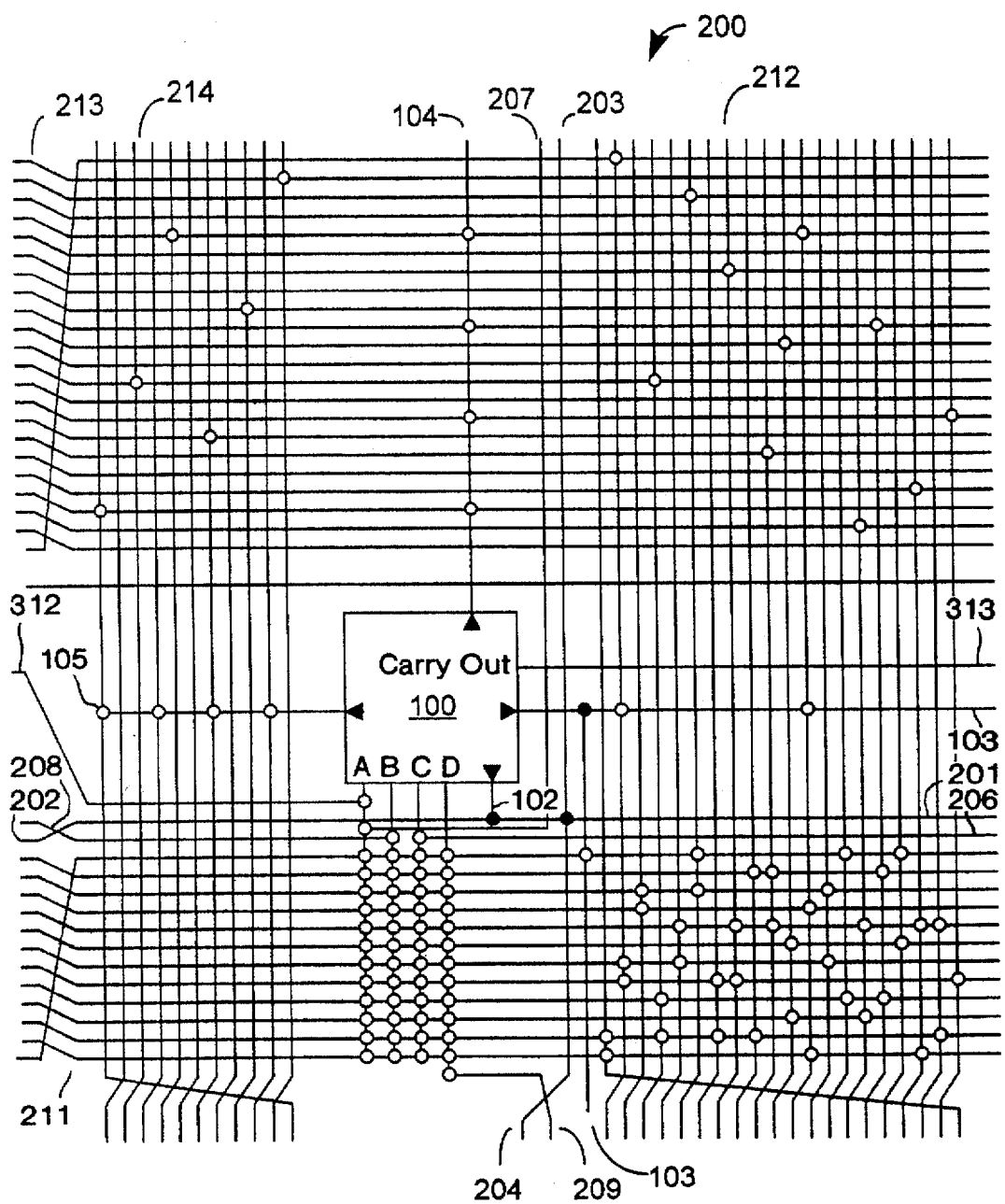
FIG. 2 illustrates an example tile used to build an FPGA in accordance with the present invention.

A key advantage in accordance with the present invention is a hierarchical architecture that can be implemented as a tile that can be reproduced through step and repeat processing to create a large FPGA structure. As shown in FIG. 2, tile 200 comprises a PALE 100 with associated atomic pieces of interconnect structure. In FIG. 2, hollow circles positioned over an intersection of two lines indicates a programmable interconnection that selectively couples the two lines. Solid black circles in FIG. 2 indicate a fixed or hardwired connection between two intersecting lines. Intersecting lines that do not have a hollow or solid circle at their intersection are electrically decoupled.

As set out hereinbefore, the logical structure shown in FIG. 2 may or may not resemble a physical implementation of the present invention. The logical description and illustration shown in FIG. 2 can be implemented in any known IC technology. The number of wires in each hierarchy level is a matter of design choice, as is the number of programmable switches and the placement of the programmable switches. The particular example given is for illustration and understanding, but is not to be construed as a limitation on the teachings of the present invention.

Output driver 102 is coupled to what is referred to herein as a "level zero" interconnect or "tunnel". The tunnel is hardwired out of each tile 200 towards nearest neighbor tiles on each of the four sides of tile 200. Line 201 couples output driver 102 to a tile on the right of tile 200. Likewise, line 202 couple output driver 102 to a tile to the left of tile 200, line 203 couples output driver 102 to a tile above tile 200, and line 204 couples driver 102 to a tile below tile 200.

Lines 206, 207, 208 and 208 are tunnel lines coming into tile 200 from the adjacent nearest neighbor tiles. Line 206 from the right tile is selectively coupled through a programmable switch to the C data input to tile 100. Line 207 from the tile above tile 200 is selectively coupled to the C data input of PALE 100. Likewise, line 208 from the left and line 209 from below are each programmably coupled to the A and D data inputs respectively.

The eight lines 201, 202, 203, 204, 206, 207, 208 and 209 comprise the level 0 interconnect and provide local interconnection between nearest neighbor tiles. In accordance with the present invention, the level 0 interconnect uses only a single programmable switch to couple any PALE 100 output to any nearest neighbor PALE 100, hence provides low-loss, low-delay connections. Because many circuit designs require a large number of these local interconnections between neighboring PALES, the level 0 interconnect services a high percentage of the entire interconnection demand with comparatively low overhead in terms of chip area dedicated to programmable switches and wires.

In the preferred embodiment, the level 0 interconnect formed by the tunnel lines 201–209 is not strictly hierarchical in that tiles above and below tile 200 are in a different hierarchical group than are tiles to the left and right of tile 200. This provides a hybrid architecture that employs a symmetrical or flat interconnect architecture for the level 0 interconnect to provide rich local interconnectivity, but relies on a more traditional hierarchical structure for longer interconnections. This distinction of the present invention over the prior art will be more apparent in the discussion of the hierarchical interconnect structure below.

Tile 200 comprises atomic pieces of a level one interconnect bus 211 formed by 12 wires that intersect the A, B, C, and D inputs to PALE 100 in the preferred embodiment. Tile 200 also comprises atomic pieces of a level two interconnect bus 212, a level three interconnect bus 213, and a level four interconnect bus 214. Output driver 103 couples the output signal of PALE 100 to selected wires of level one interconnect bus 211 and level two interconnect bus 212 through programmable switches.

In a conventional hierarchical structure output signals are coupled only to one hierarchical level, for example, level one bus 211. Hence, in a conventional structure a signal must pass through at least two switches to reach from a PALE output to the level two interconnect bus. In contrast, the present invention provides a direct connection or "hyperlink" from each PALE 100 to the level two interconnect bus. The hyperlink eliminates one switch from the signal path as compared to the prior art. Although the architecture in accordance with the present invention can also pass signals in the conventional manner (i.e., level by level using a switch at each level crossing), the hyperlinks greatly reduce the number of switches.

Output driver 104 couples to selected wires of level three interconnect bus 213 providing a hyperlink to the level three interconnect bus. Further, output driver 105 provides a hyperlink from PALE 100 to selected wires of the level four interconnect bus. The conventional hierarchical interconnect requires at least three programmable switches to reach level three interconnect bus 213 and at least four switches to reach level four interconnect bus 214. It should be understood that the references to conventional interconnect structures are provided for comparison only because the inventors are not aware of an FPGA having four or more levels of hierarchy, in part because of the increasing number of switches required as more levels of hierarchy are added.

The tileable structure in accordance with the present invention provides the advantages of a hierarchical structure in tileable architecture suitable for step and repeat processing.

4. Hierarchical Interconnect Structure.

The hierarchical interconnect structure in accordance with a preferred embodiment of the present invention is implemented as a multi-level (levels 0–6) logical hierarchy that is preferably implemented in three metal layers of an integrated circuit. The hierarchical structure is supplemented by a carry subsystem that provides special purpose interconnections in the preferred implementation. When tiles are placed side by side, six levels of interconnect bus hierarchy are formed (i.e., four levels on each chip plus two levels connecting multiple chips) as well as the level 0 structure that provides local interconnections.

Figure 3:
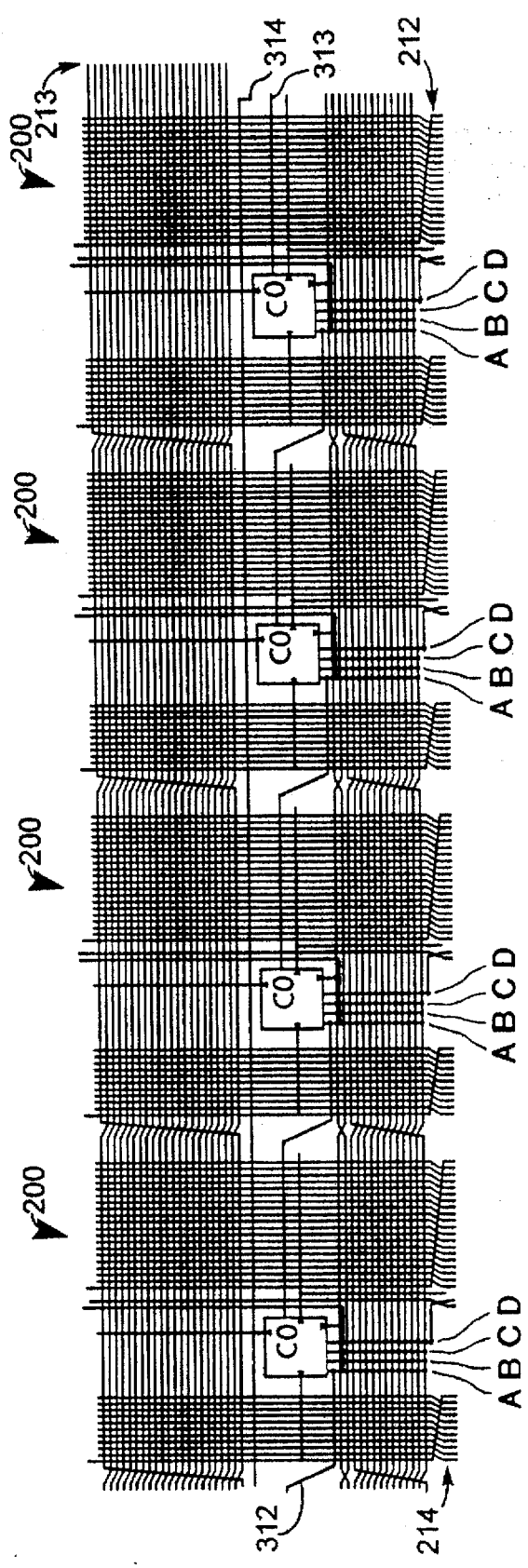
FIG. 3 shows a group of the tiles of FIG. 2 combined to form a higher hierarchical level called a "leaf"

FIG. 3 illustrates how four tiles similar to tile 200 in FIG. 2 are combined to form a hierarchy level called a "leaf" 300. Although any number of tiles 200 could be grouped together to form a leaf 300, four tiles 200 was found to offer the most efficient use of chip area when high level interconnect and routing are considered. The number of elements in any hierarchy level is chosen to make efficient use of a control bus (not shown) used to program the FPGA.

The four tile leaf 300 of the preferred implementation provides tight coupling of the logic elements through a carry subsystem (described below) and direct nearest neighbor connections allowing efficient packing of logic into macrocircuits (e.g., counters, shift registers, adders, and the like).

In the particular example, tile 200 is stepped horizontally and repeated four times to generate leaf 300. The level one interconnect bus 211 becomes continuous across leaf 300 as does the level three interconnect bus 213. In accordance with the present invention, level one bus 211 terminates at the boundary of leaf 300 while level three interconnect bus 213 extends beyond leaf 300 to provide connections to adjacent leaves to the left and right of leaf 300. To accomplish this, the design of leaf 300 is modified after the step and repeat of tile 200 by changing the left and right sides so as to extend interconnect bus 213 farther than interconnect bus 211. Other modifications can also be made to enhance connectivity of the carry subsystem, for example. Level two interconnect bus 212 and level four interconnect bus 214 also extend beyond the leaf boundary to couple to leaves above and below leaf 300 but at this stage require no modification.

Figure 4:
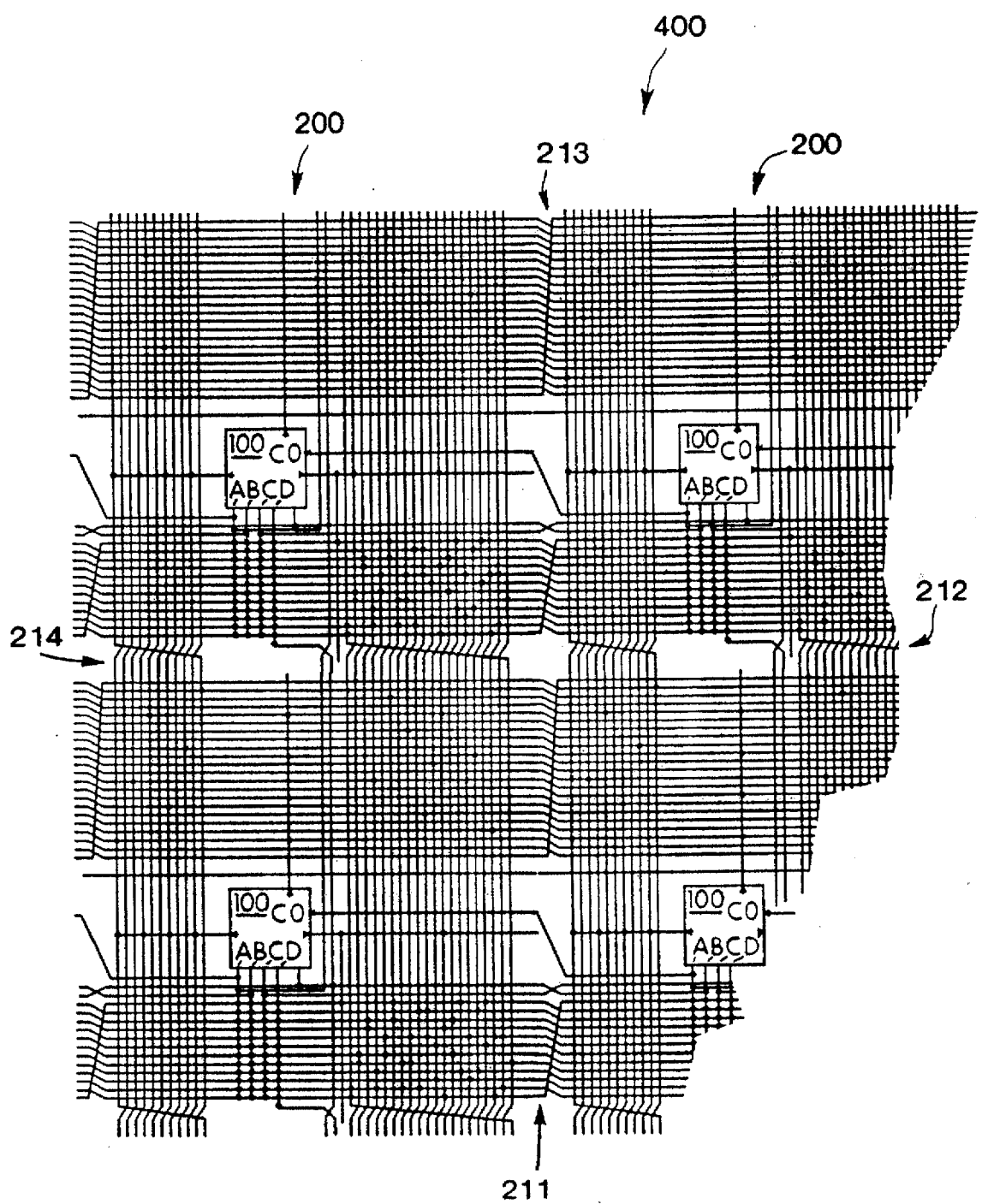
FIG. 4 shows a group of leaves shown in FIG. 3 combined to form a portion of a hierarchy level called a "block"

Once leaf 300 is layed out, it becomes the building block for the next higher level of hierarchy, called a "block". Hence, the variations of the level three interconnect bus 213 occurring at the right edge of leaf 300 are designed only one time thereby minimizing design effort. As leaf 300 is duplicated using step and repeat processing a higher level of hierarchy called a "block" (a portion of which is shown in FIG. 4) is formed. Block 400 comprises a number of leaves 300 vertically stacked on top of each other as shown in FIG. 4 with level two interconnect bus 212 extending across all of block 400 and terminating at the edges of block 400.

Block 400 is formed in a manner similar to leaf 300 in that the step and repeat process is followed by a modification of the edges to create a tileable unit for the next hierarchy level. In the case of block 400 shown in the specific example of FIG. 4, the upper and lower edges are modified so as to terminate level two bus 212 at the upper and lower edges of block 214 while allowing level four bus 214 to extend outward beyond the boundary of block 400.

Figure 5:
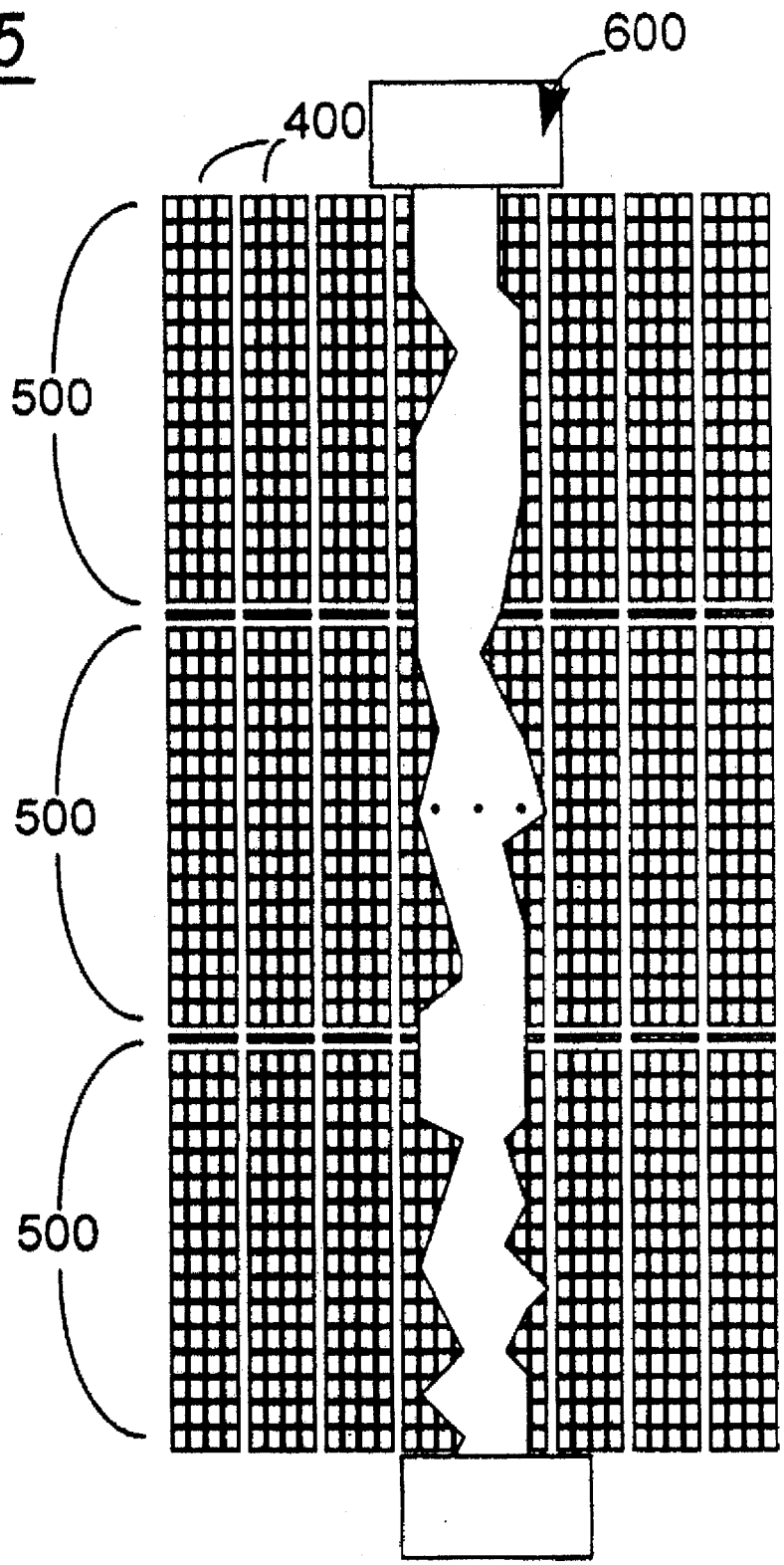
FIG. 5 shows an FPGA integrated circuit (IC) having an architecture in accordance with the present invention having multiple hierarchy levels.

Block 400 can be duplicated using step and repeat processing to form a higher level called sector 500 shown in FIG. 5. Level three interconnect bus 213 extends across and is confined within sector 500. Level four interconnect structures combine to extend across boundaries of sector 500 to cross the entire chip.

In the example structure, level two interconnect bus 212 is formed by eighty wires (20 per tile×4 tiles per leaf) extending along the height of the stacked leaves 300 in each block 400. Level two interconnect bus 212 allows data traffic between only the sixteen leaves 300 in each block 400. Where level two interconnect bus 212 crosses level one interconnect bus 211 a fully programmable crossbar matrix could be formed at the intersection of each level two wire with each level one wire. However, a full crossbar switch is prohibitively complex. In the preferred implementation, a sparsely populated crossbar is used. When a sparsely populated crossbar is used, certain modifications are required to provide sufficient diversity to enable easy placement and routing of a design into the FPGA. These modifications are discussed in greater detail below in the section entitled "interconnect enrichment."

The programmable switches preferably conduct signals only from level two bus 212 to level one bus 211 but are not intended to conduct signals from level one bus 211 upward to level two bus 212. This feature simplifies switch design and when imposed as a constraint during routing of a design into the FPGA in accordance with the present invention, greatly simplifies compilation. To enable switches between hierarchy levels to be single direction only, the hyperlink structure described above is required.

In the specific example, fifteen blocks 400 are arranged side-by-side in addition to one memory block to form a sector 500. Level three interconnect bus 213 is formed by up to 352 wires (22 per leaf×16 leaves per block) extending along the length of the sector. As described hereinafter, some of the 352 wires available for the level three wires can be user designated to a higher level of hierarchy. Hence, the actual number of wires in the level three interconnect bus 213 will vary from application to application. For ease of description, level three interconnect bus 213 may also be referred to as the level three/six interconnect bus 213.

Level three/six interconnect bus 213 allows data traffic between only the fifteen blocks 400 in a sector 500. The level six interconnect bus allows data traffic between chips 600 (shown in FIG. 6) Level three interconnect bus 213 crosses level two interconnect bus 212 and in the specific example, a sparsely populated crossbar is formed by programmable switches placed at selected intersections of level three wires 213 and level two wires 212. Again, signals are preferably allowed only to couple from level three bus 213 to level two bus 212 and not from level two bus 212 upward to level three bus 213.

In the specific example three sectors are stacked on top of each other to form integrated circuit chip 600 shown in FIG. 5. Level four interconnect bus 214 is formed by 660 wires (11 wires per tile×4 tiles per leaf×15 leafs per sector), some of which may be user-designated to a level five interconnect bus described below. For ease of description, the 660 wires available to level four interconnect 214 may alternatively be referred to as a level four/five interconnect 214. The level four portion of interconnect bus 214 carries data traffic between only sectors 500 on the integrated circuit chip 600. The level five portion of interconnect 214 allows data traffic to extend to other chips 600.

Chip 600 of the specific example is thus 60 tiles wide and 48 tiles high to provide 2880 tiles on the chip. Level four/five interconnect bus 214 crosses level three/six interconnect bus 213. In the preferred implementation, a sparsely populated crossbar is used at the intersection of selected ones of the wires in level four/five bus 214 wires of level three/six bus 213. Unlike the other hierarchy levels, it is preferred that the switches coupling the level four and level three busses are bi-directional.

Figure 6:
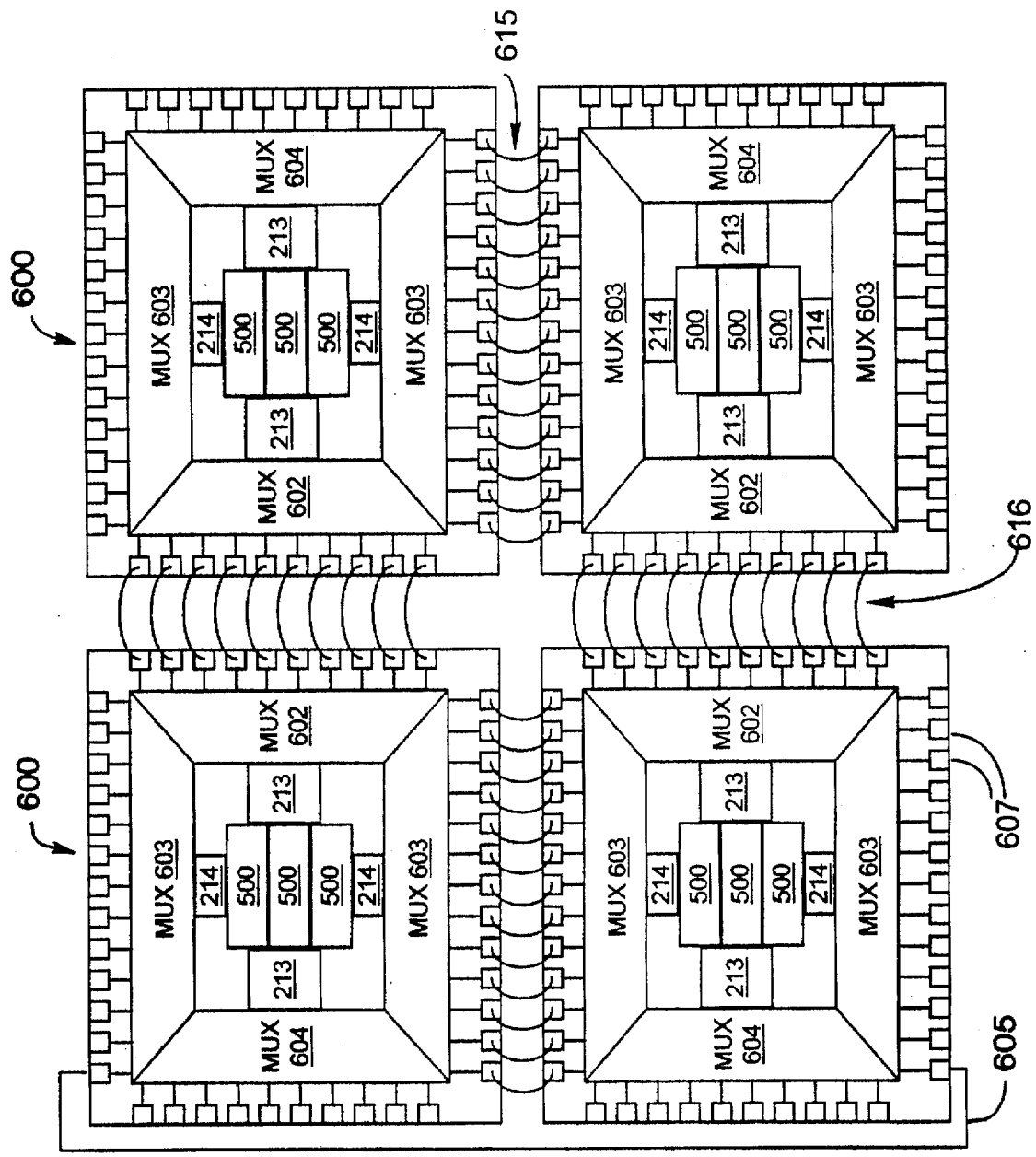
FIG. 6 shows multiple ICs of FIG. 5 interconnected to form further hierarchical levels.

Further levels of hierarchy are obtained by subdividing any of the interconnect busses as introduced earlier. In FIG. 6, multiplexer (MUX) 603 is formed on two opposed edges (i.e., North and South edges) of chip 600 to multiplex selected ones of the wires in level four/five interconnect bus 214 to form a level five interconnect bus indicated by vertically positioned wire bonds 615. The level five interconnect bus also includes wires or conductive connections 605 that wrap around multiple chips 600 to couple bondpads 607 on nonadjacent sides of chips 600. Of the eleven wires described above in level four/five interconnect bus 214, six can be programmably exchanged into level five wires 605 and 615 that are used to interconnect multiple chips 600. In other words, up to six of the eleven wires can be selectively coupled to bond pads at the perimeter of chip 600. Hence, the actual number of level four and level five interconnects is dynamic in that they can be freely exchanged with each other. Level four bus 214 terminates at the chip 600 boundary while the level five bus continues onto an adjacent chip 600.

A level six interconnect indicated by wires 616 in FIG. 6 is provided using multiplexers 602 to couples selected wires in the level three/six interconnect bus 213 to wirebonds 616. Multiplexers 604 are formed on only one edge of each chip 600 in the preferred embodiment. In the preferred example, multiplexers 604 are provided on a side of each chip 600 opposite multiplexors 602. Multiplexors 604 are used to couple selected level three and level four interconnect wires to user inputs and outputs. As shown in FIG. 6, by rotation of chips 600 so that multiplexors 602 of adjacent chips face each other, the combination of multiple chips forms the fifth and sixth levels of interconnect busing. The level six hierarchy can be formed as an extension of the level three hierarchy. Of the twenty two wires described above in level three bus 213, up to eight can be selectively switched to bondpads on the chip perimeter. Once coupled to a bondpad, the level six bus can be extended through wirebonds or other known chip interconnection techniques to adjacent FPGA chips 600. Hence, the actual width of level three and level six buses is dynamic in that they can be freely exchanged with each other. Level three bus 213 terminates at the chip 600 boundary while the level six bus continues onto an adjacent chip or to primary I/O.

More than four chips can be coupled together and in the preferred embodiment, six chips are coupled. A practical limitation on the number of chips that can be coupled as shown in FIG. 6 is dictated by, among other factors, the number of PALEs 100 on each chip 600, the bandwidth that each level of interconnect bus can support as well as desired performance.

Once tiles are reproduced to form the hierarchical structure, the level one bus 211 and level two bus 212 lines are relatively short and as a result need no buffering along the length of the lines. The level three bus 213 and level four bus 214 lines, however, extend the length and breadth of the chip 600 and are subject to significant signal speed degradation due to RC effects. Hence, buffers (not shown) are desirably placed in the level three and four busses to ensure clean logic states and edges. Because the direction of the signals on each line is unknown before the circuit placement and routing, the buffers preferably can be programmed to operate in a single direction. Also, the buffers preferably can be disabled to create a high impedance break in the bus line that serves to segment the portions of a line on either side of the buffer. The segmentation of the bus lines adds to the effective bus width by allowing unused portions of the bus to be recycled. The segmentation can also reduce the propagation delays due to RC effects by selectively shortening the bus line length.

Hierarchy levels two and four/five are physically implemented in metal layer 3. Hierarchy level three/six is implemented in metal layer 2. Hierarchy level one is implemented in metal layer 1. The conductors in layer 2 are oriented perpendicular to the conductors in layers 1 and 3. In each layer, the metal wires are oriented substantially parallel to each other except for periodic wire rotations that occur as the wires pass from one tile to an adjacent tile.

A plurality of SRAM-controlled switches are positioned where wires from one level cross over wires from another level for programmably coupling one level to the next level to form the cross bar matrices described above. The SRAM controlled switches are preferably unidirectional switches so that signals can only propagate downward from level one to PALE 100 inputs. Similarly, unidirectional switches are used to connect level two to level one and level three to level two so that signals can only propagate downward one hierarchical level. The programmable switches in the level four to level three crossovers are bi-directional allowing signals to propagate upward and downward.

A great deal of specific information is given to describe and illustrate the specific implementation of the present invention. It is expressly understood that the present invention is not limited by the specific design criteria given herein. Implementations may vary by the number of elements in each hierarchy level as well as the number of wires used in each interconnect level. Switches may be unidirectional where indicated (if hyperlinks are used) or bi-directional. Switches may be reprogrammable or one time programmable. These an other modifications that are apparent to those skilled in FPGA design are mere extensions and equivalents to the structure in accordance with the present invention.

5. Carry Subsystem.

To supplement the interconnect structure set out above, special purpose interconnects may also be provided. For example, a carry subsystem including carry-in line 312 and carry-out line 313 shown in FIG. 2 as well as carry return wire 314 shown in FIG. 3 is implemented in the preferred embodiment. The carry subsystem allows each PALE to calculate both a main output term and a carry output term. The carry term is connected to a selected data input (e.g., the A data input in FIG. 2) of the neighbor PALE 100 in the tile 200 to the right only.

The carry signal can propagate through many PALEs 100 in a leaf 300 and can be returned to the beginning of the next leaf 300 using the carry return wire 314. In the tileable architecture of the present invention, each tile includes an atomic portion of the carry return wire as shown in FIG. 2. After the step and repeat process used to form a leaf 300, the carry output line 213 of an edge tile 200 in each leaf 300 is hard wired to carry return line 314. Similarly, carry in line 312 is coupled at an opposite side of leaf 300 to carry return line 314 from a lower adjacent leaf 300. This enables a register, counter or adder to be formed using up to all of the tiles 200 in a block 400. Preferably the carry system does not extend outside of any block 400.

6. Interconnect Enrichment.

As described above, sparsely populated crossbar switch matrices are preferably used to couple each interconnect bus to the next lower hierarchy interconnect bus. A full crosspoint programmable interconnect array has the potential advantage of 100% connectivity for all signals. However, each programmable switch takes up significant area on the chip and only a few will be used in each circuit design, hence, full cross-point matrices are inefficient The hyperlink feature of the present invention relieves some pressure from the cross-point switch matrices in that each cross-point matrix needs only hierarchically downward signal propagation. It will be recalled that the hyperlinks handle the hierarchically upward signal propagation.

Interconnectivity is further enhanced by pseudo random switch placement in the cross-point matrices. It has been found that regularly ordered switch placement in the crosspoint matrices creates difficulty when compiling a design into the FPGA. This is particularly true for large FPGAs. Generally this difficulty arises because the interconnections available in one portion of the chip 600 are identical to the interconnections available in another portion of the chip 600—interconnect diversity is limited by the regular array of switches.

In accordance with the present invention, the lines comprising each of the level one through four interconnect busses 211–214 rotate as the lines cross from one tile 200 to the adjacent tile 200. This is indicated in FIG. 2 and FIG. 3 by looking to the edge of tile 200. For example, each wire of bus 211 at one side of tile 200 turns upward and indexes by one wire position except for the uppermost wire which rotates or indexes downward by the full width of bus 211. A similar arrangement exists on all of the busses.

During rotation, all but one line rotate by one position in a first direction, and the one remaining line rotates back in the other direction over the entire bus, crossing all the other lines in the bus. The wire rotation allows the interconnect switches to be physically located in a regular pattern so that each tile is identical, but at the same time allowing the switches to appear at electrically different positions on the interconnect busses in adjacent tiles 200. Hence, the interconnect diversity problem is solved without compromising a tileable structure that can be easily manufactured.

Another feature that increases interconnectability is the freely tradable resources on the ⅗ and ⅘ busses discussed above. In FPGA design bus widths are chosen by statistical analysis of the traffic that is expected to flow on the bus. The statistical analysis gives a mean bus width design criteria and a variance (i.e., standard deviation squared). A bus width is chosen that accommodates not only the mean bus width, but some portion of the statistical tail (i.e., two or three times the standard deviation) so that a sufficient number of designs can be implemented in the FPGA.

In designing a bus with fluidly shared resources, the bus width is determined by adding the mean bus width of each of the busses and then adding the square root of the sum of the individual variances. This results in a narrower bus that is able to handle traffic that would have required more lines if realized in two independent busses. In the preferred implementation for example, the 22 line wide level ⅗ bus would require 25 lines if implemented as two separate busses.

A preferred approach is to implement a full or rich crossbar matrix to couple the level five and level six interconnect busses to bond pads at the chip perimeter. Although a minimal interconnect that couples each line of the level five and level six buses to a bondpad is acceptable, this minimal interconnect then links the placement/routing of a design into one FPGA to the placement/routing of a design in an adjacent FPGA of a multi-chip design. A full crossbar matrix will isolate the two design problems so that after chip level partitioning is complete, the compilation of a design into each integrated circuit chip can be performed independently, greatly reducing the amount of information that must be processed simultaneously during compilation. This has a practical effect of allowing compilation on smaller, less powerful computers and workstations.

7. Conclusion

By now it is appreciated that a field programmable gate array architecture is provided with very hierarchical interconnection that is efficient to design and provides efficient use of interconnect resources. The details of the specific examples illustrated and described in accordance with the preferred embodiments are provided for completeness only, and are not considered limitations on the teachings of the present invention. Accordingly, the many modifications of the specific implementation including the modifications expressly suggested herein are equivalent to the preferred embodiments described herein.

I claim:

1. A programmable logic device comprising:
   a plurality of programmable atomic logic elements (PALEs) wherein each PALE has a plurality of data inputs and generates a data output signal;
   a plurality of leafs wherein each leaf comprises a number of PALEs and a level one interconnect bus confined within the leaf;
   a plurality of blocks wherein each block comprises a number of leafs and a level two interconnect bus confined within the block;
   a plurality of sectors wherein each sector comprises a plurality of blocks and a level three interconnect bus confined within the sector;
   a first driver within each PALE for driving the data output signal out of the PALE into one or more immediately adjacent PALEs;
   a second driver within each PALE for driving the data output signal out of the PALE;
   a first programmable hyperlink associated with each PALE coupling the second driver to the level one interconnect bus of one of the leafs;
   a second programmable hyperlink associated with each PALE coupling the second driver to the level two interconnect bus of one of the blocks;
   a third driver within each PALE for driving the data output signals out of the PALE; and
   a third programmable hyperlink associated with each PALE coupling the third driver to the level three interconnect bus of one of the sectors.

2. The programmable logic device of claim 1 wherein the plurality of sectors are formed on a single integrated circuit chip and the device further comprises:
   a level four interconnect bus confined within the chip;
   a fourth driver within each PALE for driving the data output signals out of the PALE; and
   a fourth programmable hyperlink associated with each PALE coupling the fourth driver to the level four interconnect bus of the chip.

3. The programmable logic device of claim 1 wherein the plurality of sectors are formed on a plurality of integrated circuit chips and the device further comprises:
   a level four interconnect bus confined within each of the chips;
   a fourth driver within each PALE for driving the data output signals out of the PALE; and
   a fourth programmable hyperlink associated with each PALE coupling the fourth driver to the level four interconnect bus of the chip.

4. The programmable logic device of claim 3 wherein the device further comprises:
   a level five interconnect bus extending in a first direction from each chip to another chip, wherein the fourth programmable hyperlink programmably couples the fourth driver to the level five interconnect bus; and
   a level six interconnect bus extending in a second direction from each chip to another chip, wherein the third programmable hyperlink programmably couples the third driver to the level six interconnect bus.

5. The programmable logic device of claim 1 wherein the number of PALES in each leaf differs from the number of leaves in each block.

6. The programmable logic device of claim 1 wherein the second programmable hyperlink comprises a plurality of switches, wherein each of switch couples the second driver to a unique wire of the level two interconnect bus; and
   the third programmable hyperlink comprises a plurality of switches, wherein each switch couples the third driver to a unique wire of the level three interconnect bus.

7. The programmable logic device of claim 1 further comprising:
   a fully populated crossbar matrix coupling the level one interconnect bus to the PALE data inputs within a leaf;
   a first sparsely populated crossbar matrix coupling the level two interconnect bus to the level one interconnect bus; and
   a second sparsely populated crossbar matrix coupling the level three interconnect bus to the level two interconnect bus.

8. The programmable logic device of claim 7 wherein the fully populated crossbar matrix, the first sparsely populated crossbar matrix, and the second sparsely populated crossbar matrix comprise switches that conduct signals in one direction from the higher level interconnect bus to the lower level interconnect bus.

9. A programmable logic device comprising:
   a plurality of programmable atomic logic elements (PALEs) wherein each PALE has a plurality of data inputs and generates a data output signal;.
   a plurality of hierarchically coupled partitions, wherein each partition comprises a unique set of the next lower hierarchy partitions and an interconnect bus that extends only to the unique set of the next lower partitions that are within that partition, and wherein the lowest level of hierarchy is one of the plurality of PALEs;
   a plurality of hyperlinks provided within each PALE programmably coupling the PALE data output signal to each of the interconnect busses in each of the higher levels of hierarchy that include the PALE.

10. The programmable logic device of claim 9 wherein each partition further comprises:
    a crossbar switch matrix programmably coupling the interconnect bus to the interconnect busses of each of the next lower partitions that are within that partition.

11. The programmable logic device of claim 10 wherein the crossbar switch matrix is sparsely populated.

12. The programmable logic device of claim 10 wherein the crossbar switch matrix allows signal propagation in one direction only from the interconnect bus to the interconnect busses of the next lower partitions.

13. The programmable logic device of claim 9 wherein each PALE further comprises a plurality of tunnel connections for electrically coupling the PALE data output signal to data inputs of adjacent neighbor PALEs without using the interconnect busses or hyperlinks.

14. A method for programing a target circuit design into programmable logic devices comprising the steps of:
    mapping the circuit design into a plurality of networks defined in terms of fundamental programmable units of the programmable logic devices and interconnections between the fundamental programmable units;
    providing a plurality of hierarchically related logical partitions on the programmable logic device, wherein a number of the partitions are included in each hierarchy level and each partition on a given hierarchy level has a interconnect bus that is electrically isolated from the other of the number of partitions on the given hierarchy level;

recursively partitioning the mapped circuit design into portions that fit into partitions at successively lower hierarchy levels until each portion is capable of fitting into one of the fundamental programmable units;

providing a plurality of hyperlinks associated with each of the fundamental programmable units wherein the hyperlinks allow the fundamental programmable unit to communicate with the interconnect bus of any logical partition at a higher level of which the given fundamental programmable unit is a member.

15. The method of claim 14 further comprising the step of:

creating interconnections between fundamental logic units in a given partition using the interconnect bus of that partition; and creating interconnections between fundamental logic units outside of a partition using the hyperlinks.

16. The method of claim 14 wherein at least one hierarchy level has a number of logical partitions that is different from the number of logical partitions at another hierarchy level.

17. The method of claim 14 further comprising the step of providing a plurality of tunnels associated with each of the fundamental programmable units wherein the tunnels allow the fundamental programmable unit to communicate with adjacent neighbor fundamental programmable units without using the hyperlinks or interconnect busses.

18. A programmable logic device comprising:

a plurality of programmable atomic logic elements (PALEs);

a plurality of hierarchically coupled partitions, wherein each partition comprises a unique set of the next lower hierarchy partitions and an interconnect bus that extends only to the unique set of the next lower partitions that are within that partition, and wherein the lowest level of hierarchy is one of the plurality of PALEs, wherein the interconnect bus of at least two of the partitions share a finite number of interconnect resources that are reconfigurably assigned by a user to an interconnect bus of either one or the other of the at least two partitions.

* * * * *

UNITED STATES PATENT AND TRADEMARK OFFICE
Certificate

Patent No. 5,742,181                                                                                                 Patented: April 21, 1998

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Kenneth Rush, Colorado Springs, CO and Gregory S. Snider, Mountain View, CA.

Signed and Sealed this Fourth Day of December 2001.

MIKE J. TOKAR
*Supervisory Patent Examiner*
Art Unit 2819